(12) United States Patent
Ou et al.

(10) Patent No.: US 10,097,178 B1
(45) Date of Patent: Oct. 9, 2018

(54) ISOLATED BIDIRECTIONAL HIGH-VOLTAGE ANALOG SWITCH

(71) Applicant: SUNLITE SCIENCE & TECHNOLOGY, INC., Lawrence, KS (US)

(72) Inventors: Haijiang Ou, Endicott, NY (US); Xiaofang Suo, Lawrence, KS (US)

(73) Assignee: SUNLITE SCIENCE & TECHNOLOGY, INC., Lawrence, KS (US)

( * ) Notice: Subject to any disclaimer, the term of this patent is extended or adjusted under 35 U.S.C. 154(b) by 13 days.

(21) Appl. No.: 15/624,058

(22) Filed: Jun. 15, 2017

(51) Int. Cl.
  *H03K 17/00* (2006.01)
  *H03K 17/687* (2006.01)
  *H03K 17/60* (2006.01)

(52) U.S. Cl.
  CPC ......... *H03K 17/6874* (2013.01); *H03K 17/60* (2013.01)

(58) Field of Classification Search
  None
  See application file for complete search history.

(56) References Cited

U.S. PATENT DOCUMENTS

| 4,595,847 A | 6/1986 | Weir |
| 6,509,781 B2 | 1/2003 | Dufort |
| 7,453,310 B2 | 11/2008 | Ota et al. |
| 8,698,546 B1* | 4/2014 | Mishra ............... H03K 17/6871 327/388 |
| 8,766,700 B1* | 7/2014 | Mishra ............... H03K 17/6871 327/388 |
| 2011/0133813 A1* | 6/2011 | Guo ..................... H03K 17/145 327/427 |

* cited by examiner

*Primary Examiner* — Long Nguyen
(74) *Attorney, Agent, or Firm* — Erise IP, P.A.

(57) ABSTRACT

Embodiments of the present disclosure include a bidirectional analog switch having a pair of high-voltage transistors coupled together via a common source and gate. The switches are configured to effectively isolate an input terminal from an output terminal by passing leakage and feedthrough to a power supply. In certain embodiments, an off-state pinned switch pins the common source voltage to a power source voltage. A logic circuit receives an input logic signal and generates two non-overlapped output logic signals for controlling the pair of transistors and the off-state pinned switch. In other embodiments, a resistor pins the common source voltage to a power supply voltage for passing leakage and feedthrough to the power supply.

20 Claims, 5 Drawing Sheets

ISOLATED BIDIRECTIONAL HIGH-VOLTAGE ANALOG SWITCH

BACKGROUND

1. Field

Embodiments of this disclosure relate generally to the field of switch control electronics, and more specifically to bidirectional high-voltage analog switches.

2. Description of the Related Art

Many bidirectional high-voltage analog switches have been provided in a variety of ways in prior art switch control electronics. For example, U.S. Pat. No. 4,595,847 to Weir discloses a high-voltage bidirectional analog switch, U.S. Pat. No. 6,509,781 to Dufort discloses a level shifter that controls a bidirectional high voltage analog switch, and U.S. Pat. No. 7,453,310 B2 to Ota et al. discloses a high-voltage switching circuit.

SUMMARY

In an embodiment, an isolated bidirectional high-voltage analog switch between an input terminal and an output terminal is provided. The switch includes a first transistor operatively coupled to a second transistor via a common source and a common gate; a level shifter operatively coupled to the common source and the common gate; a logic circuit configured to receive a switch control pulse and generate a first pulse and a second pulse that is non-overlapped from the first pulse, with the level shifter being configured to receive the first pulse for controlling a voltage difference between the common source and the common gate; and, an off-state pinned switch operatively coupled to the common source and configured to pin the voltage of the common source to a low-voltage power source, with the off-state pinned switch being configured to receive the second pulse for controlling the off-state pinned switch.

In another embodiment, a bidirectional analog switch is provided. The switch includes a first transistor operatively coupled to an input terminal; a second transistor operatively coupled to an output terminal, with the first transistor and the second transistor being coupled together via a common source and a common gate; a level shifter operatively coupled to the common source and the common gate for controlling a voltage difference between the common source and the common gate; an off-state pinned circuit operatively coupled to the common source and configured to pin the voltage of the common source to a high-voltage source; and, a logic circuit configured to receive an input logic signal, generate a first output logic signal for controlling the level shifter, and generate a second output logic signal for controlling the off-state pinned circuit, such that leakage and feedthrough from the input terminal and the output terminal are passed to the high-voltage power source, thereby isolating the input terminal from the output terminal.

In yet another embodiment, a high-voltage bidirectional analog switch is provided. The switch includes a first transistor operatively coupled to an input terminal; a second transistor operatively coupled to an output terminal, with the first transistor and the second transistor being coupled together via a common source and a common gate; a level shifter operatively coupled to the common source and the common gate for controlling a voltage difference between the common source and the common gate; a pull-down resistor that couples the common source to a low-voltage power supply such that leakage and feedthrough from the input terminal and the output terminal are substantially passed to the low-voltage power supply to effectively isolate the input terminal from the output terminal.

In another embodiment, a high-voltage bidirectional analog switch is provided. The switch includes a first transistor operatively coupled to an input terminal; a second transistor operatively coupled to an output terminal, with the first transistor and the second transistor being coupled together via a common source and a common gate; a level shifter operatively coupled to the common source and the common gate for controlling a voltage difference between the common source and the common gate; a pull-up resistor that couples the common source to a high-voltage power supply such that leakage and feedthrough from the input terminal and the output terminal are substantially passed to the high-voltage power supply to effectively isolate the input terminal from the output terminal.

BRIEF DESCRIPTION OF THE SEVERAL VIEWS OF THE DRAWINGS

Illustrative embodiments of the present disclosure are described in detail below with reference to the attached drawing figures, which are incorporated by reference herein and wherein.

DETAILED DESCRIPTION

Analog switches alternately pass or block an electronic signal that may vary with time. When such a switch is used to block an electronic signal, the amount of isolation is defined by $20 \log_{10}(\Delta V_{out}/\Delta V_{in})$, where $\Delta V_{out}$ is the voltage change at the switch output caused by the voltage change at the switch input $\Delta V_{in}$ when the switch is in an off-state.

Typical high voltage switches have limited isolation capability (e.g., −50 dB isolation). However, some switching applications (e.g., sampling and holding voltage signals to a stacked actuator array), require −100 dB or more to obtain high voltage resolution. Therefore, an improved switch is desired that blocks leakage between its input and output and decouples feedthrough capacitors.

Figure 1:
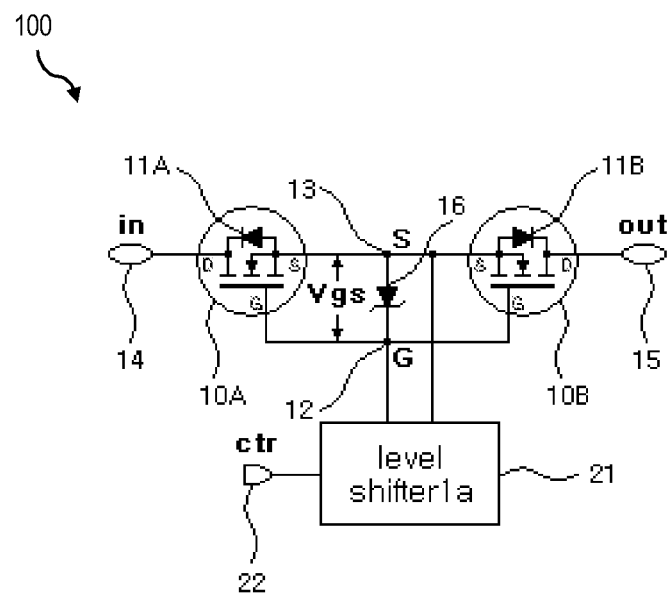
FIG. 1 is a schematic diagram showing a prior art bidirectional analog switch.

FIG. 1 is a schematic diagram showing a prior art bidirectional analog switch 100. Solid-state transistors, such as a Metal-Oxide Semiconductor Field-Effect Transistor (MOSFET) or a Bipolar Junction Transistor (BJT), are widely used as analog switches due to their small size, controllability, and reliability. The term "transistor" as used herein refers to high-voltage (HV) transistors, such as MOSFETs, BJTs, Meta-Semiconductor Field-Effect Transistors (MESFETs), or High-Electron-Mobility Transistors (HEMTs). However, most high voltage transistors are unidirectional. To configure a bidirectional HV switch, a pair of same-type transistors is often used.

FIG. 1 shows a typical HV switch configured by a pair of n-type MOSFETs 10A and 10B, each having a parasitic diode 11A and 11B, respectively. Source (S) sides of MOSFETs 10A and 10B are connected together to form a common source junction 13. Gates (G) of MOSFETs 10A and 10B are connected together to form a common gate junction 12. One drain (D) becomes an input terminal 14 of switch 100, while the other drain becomes an output terminal 15.

The gate-to-source voltage (Vgs) is a relatively low potential difference due to the limitation of breakdown voltage of oxide underneath a gate. To properly control opening of MOSFETs 10A and 10B, the Vgs is shifted to a floating voltage difference using a lever shifter 21, which shifts a switch control pulse (ctr) at a port 22 to a floating Vgs voltage difference, regardless of the potential level at common source junction 13. Switch control pulse ctr is a low-voltage logic (e.g., high or low) signal, for example. When the Vgs is turned off, MOSFETs 10A and 10B are closed. A Zener diode 16 may be added across common source 13 and common gate 12 to restrict Vgs within the voltage of Zener diode 16 (i.e., the Zener voltage), which protects the two MOSFETs from damage due to voltage spikes. Diodes 11A and 11B, as well as Zener diode 16, all have their anodes connected together to common source junction 13.

When switch 100 is in the off-state, diodes 11A and 11B connected together to common source junction 13 determine the isolation performance of switch 100. When a sufficient potential difference exists between input 14 and output 15, one of diodes 11A, 11B becomes reverse biased. When this happens, the resistance and the junction capacitance of the reverse-biased diode contributes a conductance between input 14 and output 15 by diode leakage and capacitive feedthrough, thus limiting the isolation capability of switch 100.

Figure 2:
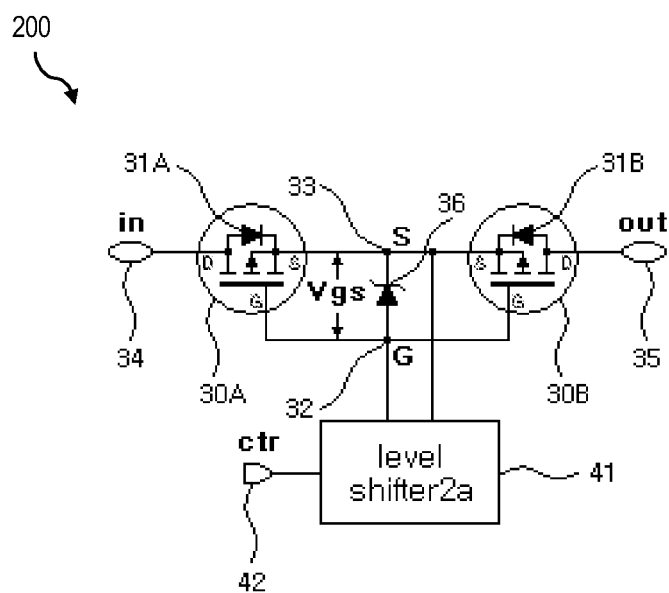
FIG. 2 is a schematic diagram showing another prior art bidirectional analog switch.

FIG. 2 is a schematic diagram showing another prior art bidirectional analog switch 200. In switch 200, a pair of HV p-type MOSFETs 30A and 30B are used instead of the n-type MOSFETS of FIG. 1. Again, source (S) sides of MOSFETS 30A and 30B are connected together to form a common source junction 33, and gates (G) are connected together to form a common gate junction 32. One drain (D) becomes an input terminal 34 of switch 200, while the other drain becomes an output terminal 35. A level shifter 41 shifts a digital control signal ctr at a port 42 to a floating Vgs potential difference to open or close MOSFETs 30A and 30B. A Zener diode 36 may be used to restrict Vgs within the Zener voltage for protecting MOSFETs 30A, 30B. Parasitic diodes 31A and 31B, as well as Zener diode 36, all have their cathodes connected together to common source junction 36. Like switch 100, the isolation capability of switch 200 is limited by conductance between input 34 and output 35 due to diode leakage and capacitive feedthrough.

Embodiments of the present disclosure provide a bidirectional high-voltage analog switch that greatly improves the isolation capability by inserting an off-state electric-potential-pinned circuit at the common source junction. In other words, when the switch is in the off-state, the potential of the common source is fixed in such a way that the two parasitic diodes are always reverse biased regardless of the voltage signal levels at the input and output. Any leakage or coupling from the input is passed to the fixed potential, and any leakage or coupling from the output is also guided to the same fixed potential. By forcing the otherwise floating potential of the common source to a fixed potential, isolation between the input and output is greatly improved. Thus, embodiments of the present disclosure not only decouple the feedthrough, but they also block any leakage from input to output.

Figure 3:
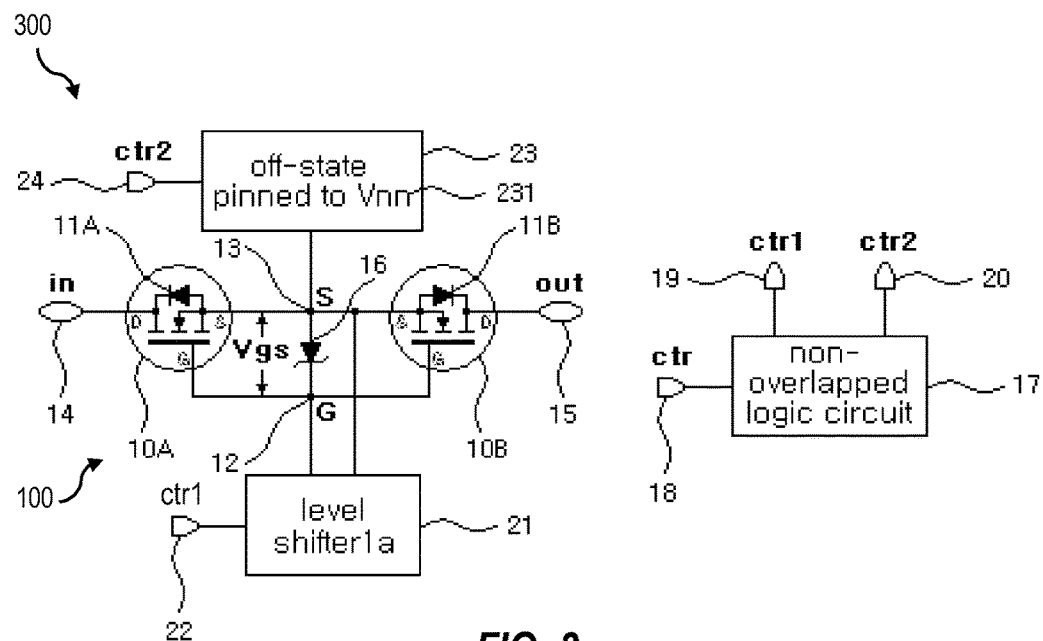
FIG. 3 is a schematic diagram of an isolated high-voltage analog switch that includes a logic circuit and a pinned low-voltage off-state circuit, in an embodiment.

FIG. 3 is a schematic diagram of an HV analog switch 300 that includes bidirectional analog switch 100, FIG. 1 having n-type MOSFETs 10A, 10B. Switch 300 further includes a non-overlapped logic circuit 17 and an off-state pinned circuit 23. All of the components depicted in FIG. 3 may be operatively coupled together into a single unit, such as an integrated circuit for example.

Non-overlapped logic circuit 17 accepts a switch control pulse ctr at a port 18, which generates two non-overlapped pulses (e.g., two distinct pulses that do not overlap in time); namely, a first non-overlapped pulse ctr1 at a port 19 and a second non-overlapped pulse ctr2 at a port 20. Switch control pulse ctr, and first and second non-overlapped pulses ctr1, ctr2 are low-voltage binary signals (e.g., high or low) used for providing logic signaling (e.g., on or off). In certain embodiments, the logic levels of pulses ctr, ctr1, and ctr2 are defined with logic-on for closing a switch/transistor/circuit and logic-off for opening a switch/transistor/circuit regardless of whether the logic state is defined by a high signal for logic-on and a low signal for logic-off, or vice-versa.

Level shifter 21 accepts ctr1 at port 22 for shifting to a floating Vgs voltage difference, as described previously in connection with FIG. 1. Off-state pinned circuit 23 accepts second non-overlapped pulse ctr2 at a port 24 to control pinning of the potential of common source junction 13 to a lowest-voltage power supply Vnn 231. Off-state pinned circuit 23 is further described below in connection with FIGS. 5 and 5B.

Non-overlapped logic circuit 17 ensures a predetermined timing among the switch control pulse ctr, first non-overlapped pulse ctr1, and second non-overlapped pulse ctr2. First pulse ctr1 immediately follows (and may overlap) switch control pulse ctr to connect input port 22 of level shifter 21 for turning switch 300 to an on-state. After a tiny delay (e.g., in the range of about 10 ns to about 1 μs), second pulse ctr2 connects to input port 24 of off-state pinned circuit 23 for determining, based on the switch state (e.g., on or off), whether common source junction 13 is to be connected to lowest-voltage power supply Vnn 231. The non-overlapped timing of first pulse ctr1 and second pulse ctr2 is important for ensuring that common source junction 13 is pinned slightly after switch 300 is turned off to prevent the input and output potentials from being influenced by the Vnn 231 potential. Likewise, common source junction 13 is preferably isolated from Vnn 231 prior to switch 300 being turned on to avoid unnecessary current spikes.

In operation, when switch 300 is initially in the off-state, switch control pulse ctr and first non-overlapped pulse ctr1 are set to logic-off and second non-overlapped pulse ctr2 is set to logic-on, which connects common source junction 13 to lowest-voltage power supply Vnn 231. Subsequently, ctr1 commands level shifter 21 to turn off Vgs, which opens MOSFETs 10A and 10B. Parasitic diodes 11A and 11B remain reverse biased regardless of the voltage levels at input port 14 and output port 15. Leakage and feedthrough from input 14 via diode 11A are entirely passed to lowest-voltage power supply Vnn 231. Similarly, any leakage and feedthrough at output 15 are also passed entirely to Vnn 231, which provides full isolation between input 14 and output 15. In certain embodiments, off-state pinned circuit 23 has an output impedance seen by common source junction 13 that is much less than the impedance of reverse-biased diodes 11A and 11B when switch 300 is in the off-state.

To turn on switch 300, switch control pulse ctr is turned to logic-on before first non-overlapped pulse ctr1 is turned to logic-on. Second non-overlapped pulse ctr2 is preferably turned to logic-off prior to ctr1 being turned to logic-on, which forces Vgs to turn on MOSFETs 10A and 10B. Therefore, when switch 300 is in the on-state, off-state pinned circuit 23 is preferably isolated from common source junction 13 (e.g., using circuits 500 or 550, as further described below in connection with FIGS. 5 and 5B, respectively). Alternatively, the output impedance of off-state pinned circuit 23, as seen by common source junction 13 is much larger than that of the on-resistance of MOSFETs 10A and 10B (e.g., see FIG. 7 and description below).

To turn off switch 300, switch control pulse ctr is turned to logic-off, and then first non-overlapped pulse ctr1 is turned to logic-off for forcing Vgs to turn off MOSFETs 10A and 10B. Following that, second non-overlapped pulse ctr2 is turned to logic-on for pinning the electric potential at common source junction 13 to that of lowest-voltage power supply Vnn 231. Non-overlapped logic circuit 17 ensures a predetermined timing among the ctr, ctr1, and ctr2.

Figure 4:
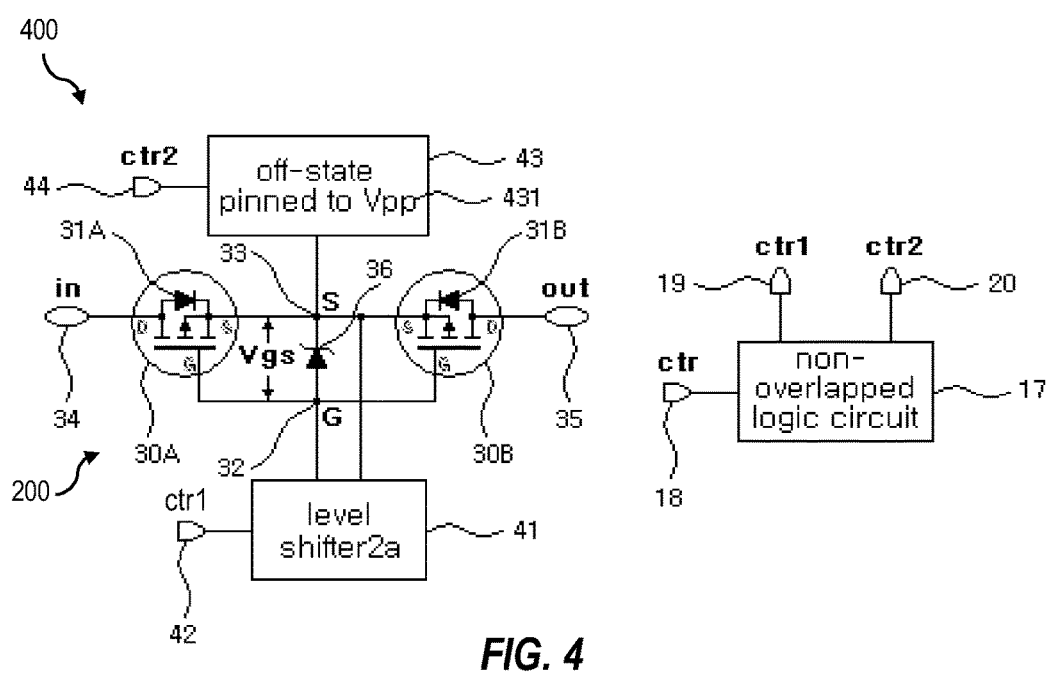
FIG. 4 is a schematic diagram of another isolated high-voltage analog switch that includes a logic circuit and a pinned high-voltage off-state circuit, in an embodiment.

FIG. 4 is a schematic diagram of an HV analog switch 400 that includes bidirectional analog switch 200, FIG. 2 having p-type MOSFETs 30A, 30B. Similar to switch 300, FIG. 3, switch 400 further includes non-overlapped logic circuit 17 and an off-state pinned circuit 43. All of the components depicted in FIG. 4 may be operatively coupled together into a single unit, such as an integrated circuit for example.

Off-state pinned circuit 43 accepts second non-overlapped pulse ctr2 at a port 44 from non-overlapped logic circuit 17 to control pinning of the potential of the common source junction 33 to a highest-voltage power supply Vpp 431 (e.g., a power supply connected to switch 400 having the highest potential). Off-state pinned circuit 43 is further described below in connection with FIGS. 6 and 6B.

Due to parasitic diodes 31A, 31B having their cathodes connected together to a common source junction 33, the pinned potential is provided by highest-voltage power supply Vpp 431, which ensures that the two diodes are reverse biased when switch 400 is in the off-state.

In operation, when switch 400 is initially in the off-state, switch control pulse ctr and first non-overlapped pulse ctr1 are set to logic-off and second non-overlapped pulse ctr2 is set to logic-on, which connects common source junction 33 to highest-voltage power supply Vpp 431. Subsequently, ctr1 commands level shifter 41 to turn off Vgs, which opens MOSFETs 30A and 30B. Parasitic diodes 31A and 31B remain reverse biased regardless of the voltage levels at input port 34 and output port 35. Leakage and feedthrough from input 34 via diode 31A are entirely passed to highest-voltage power supply Vpp 431. Similarly, any leakage and feedthrough at output 35 are also passed entirely to Vpp 431, which provides full isolation between input 34 and output 35. In certain embodiments, off-state pinned circuit 43 has an output impedance seen by common source junction 33 that is much less than the impedance of reverse-biased diodes 31A and 31B when switch 400 is in the off-state.

To turn on switch 400, switch control pulse ctr is turned to logic-on before first non-overlapped pulse ctr1 is turned to logic-on. Second non-overlapped pulse ctr2 is preferably turned to logic-off prior to ctr1 being turned to logic-on, which forces Vgs to turn on MOSFETs 30A and 30B. Therefore, when switch 400 is in the on-state, off-state pinned circuit 43 is preferably isolated from common source junction 33 (e.g., using circuits 600 or 650, as described below in connection with FIGS. 6 and 6B, respectively). Alternatively, the output impedance of off-state pinned circuit 43, as seen by common source junction 33 is much larger than that of the on-resistance of MOSFETs 30A and 30B (e.g., see FIG. 8 and description below).

Figure 5:
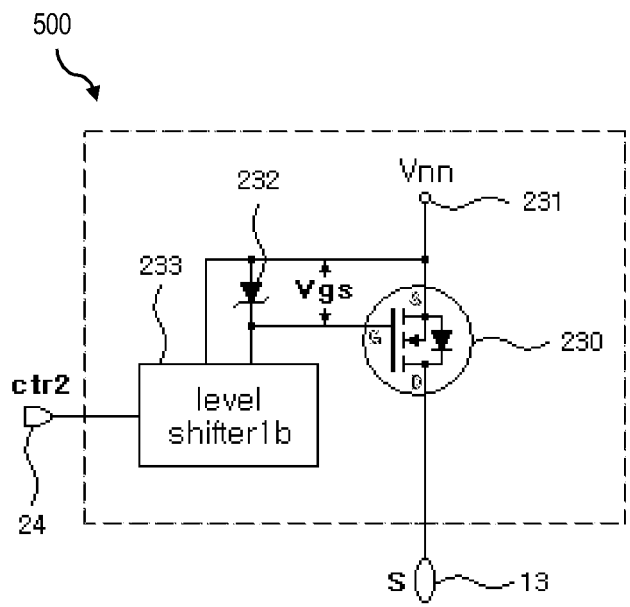
FIG. 5 is a schematic diagram of an off-state pinned circuit, in an embodiment.

FIG. 5 is a schematic diagram illustrating an off-state pinned circuit 500, which is an embodiment of off-state pinned circuit 23, FIG. 3. Circuit 500 uses an n-type MOSFET 230 as a switch to determine if the lowest-voltage power supply Vnn 231 is connected to common source junction 13. MOSFET 230 is controlled by Vgs which is further controlled by second non-overlapped pulse ctr2 at port 24 via an off-state level shifter 233. When second pulse ctr2 is set to logic-on, MOSFET 230 is closed and power supply Vnn 231 is connected to common source junction 13, thus the potential of source junction 13 is pinned to Vnn 231. When second pulse ctr2 is set to logic-off, MOSFET 230 is opened, which separates source junction 13 from Vnn 231. To protect MOSFET 230, a Zener diode 232 may be applied across the gate (G) and source (S) of MOSFET 230. In an embodiment, when Vnn equals 0V, MOSFET 230 may be directly controlled by second pulse ctr2, such that level shifter 233 and Zener diode 232 may safely be removed.

Figure 5B:
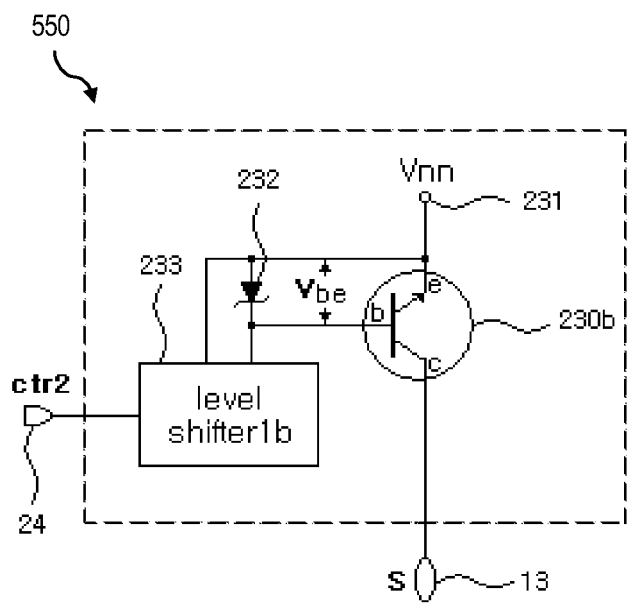
FIG. 5B is a schematic diagram of another off-state pinned circuit, in an embodiment.

FIG. 5B is a schematic diagram illustrating an off-state pinned circuit 550, which is another embodiment of off-state pinned circuit 23, FIG. 3, having a NPN transistor 230b instead of a MOSFET 230 as in FIG. 5. NPN transistor 230b includes a p-type semiconductor between two n-type semiconductors configured to form two NP junctions. An example of NPN transistor 230b is a bipolar junction transistor (BJT) having a base (b), a collector (c), and an emitter (e). The emitter is connected to the lowest-voltage power supply Vnn 231 and the collector is connected to the common source junction 13. The base and the emitter are connected to off-state level shifter 233 for controlling NPN transistor 230b to be opened or closed, via the voltage across the base and the emitter (Vbe). Similar to control of Vgs for controlling MOSFET 230, FIG. 5, Vbe is further controlled by second non-overlapped pulse ctr2 at port 24 via level shifter 233. To protect NPN transistor 230b, Zener diode 232 may be applied across the base and the emitter.

Figure 6:
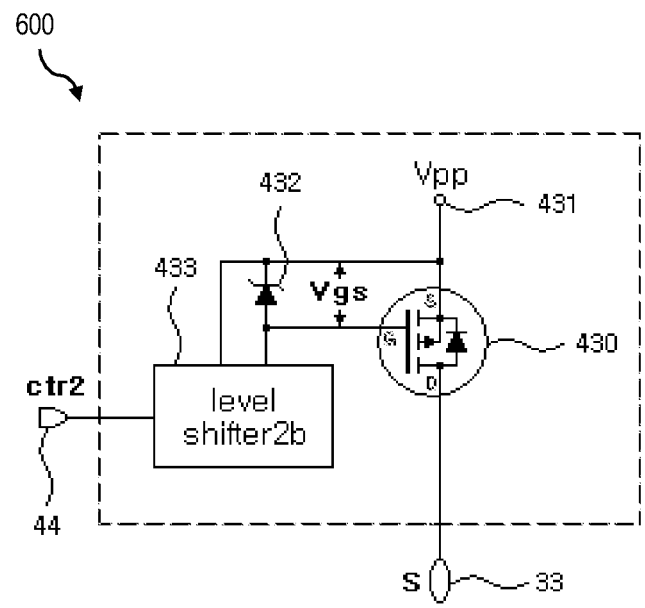
FIG. 6 is a schematic diagram of an off-state pinned circuit, in an embodiment.
Figure 6B:
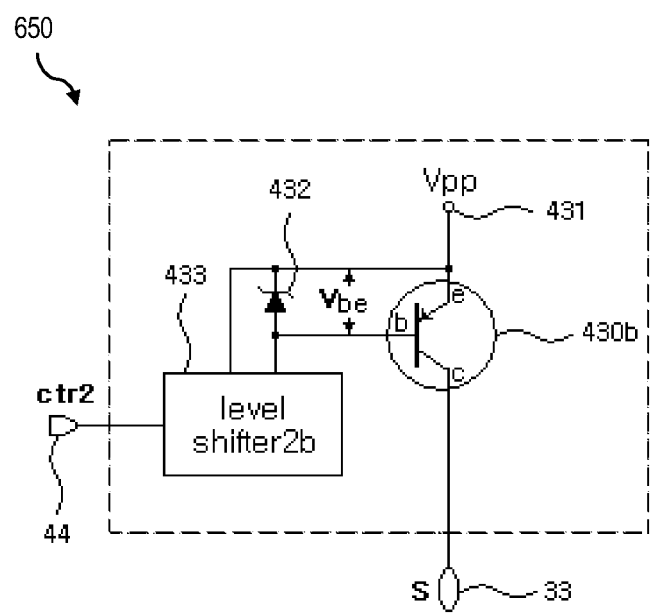
FIG. 6B is a schematic diagram of another off-state pinned circuit, in an embodiment.

FIGS. 6 and 6B are schematic diagrams illustrating different embodiments of off-state pinned circuit 43, FIG. 4. Off-state pinned circuit 600 is an example of off-state pinned circuit 500, FIG. 5 configured for pinning to highest-voltage power supply 431. Similarly, off-state pinned circuit 650 is an example of off-state pinned circuit 550, FIG. 5B configured for pinning to highest-voltage power supply 431.

As depicted in FIG. 6, off-state pinned circuit 600 includes a p-type MOSFET 430 as a switch to determine if the highest-voltage power supply Vpp 431 is connected to common source junction 33. MOSFET 430 is controlled by Vgs which is further controlled by second non-overlapped pulse ctr2 at port 44 via an off-state level shifter 433. When second pulse ctr2 is set to logic-on, MOSFET 430 is closed and power supply Vpp 431 is connected to common source junction 33, thus the potential of source junction 33 is pinned to Vpp 431. When second pulse ctr2 is set to logic-off, MOSFET 430 is opened, which separates source junction 33 from Vpp 431. To protect MOSFET 430, a Zener diode 432 may be applied across the gate (G) and source (S) of MOSFET 430.

As depicted in FIG. 6B, off-state pinned circuit 650 includes a PNP transistor 430b (e.g., a BJT) having an n-type semiconductor between two p-type semiconductors configured to form two PN junctions. PNP transistor 430b has its emitter (e) connected to highest-voltage power supply 431 and its collector (c) connected to common source junction 33. The base (b) and the emitter have voltage Vbe between them and are connected to off-state level shifter 433 for controlling opening and closing of PNP transistor 430b via second pulse ctr2 at port 44 via level shifter 433. To protect PNP transistor 430b, Zener diode 432 may be applied across the base and the emitter.

Figure 7:
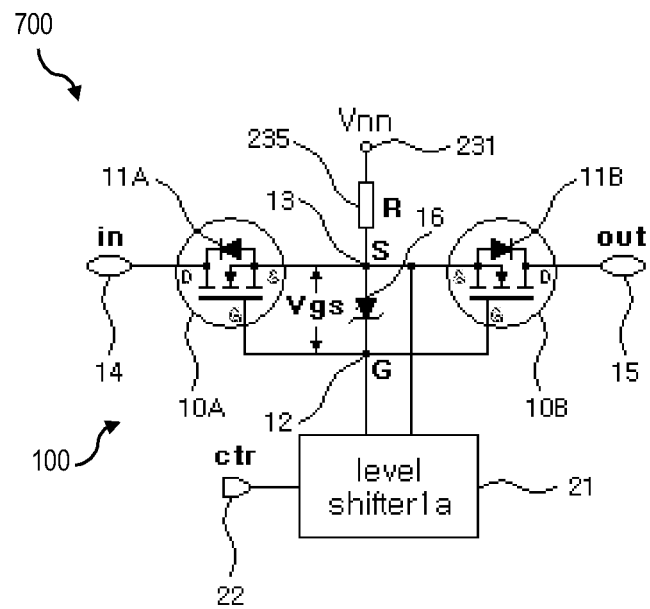
FIG. 7 is a schematic diagram of a high-voltage analog switch that includes a pull-down resistor, in an embodiment.

FIG. 7 is a schematic diagram of an HV analog switch 700 that includes bidirectional analog switch 100, FIG. 1 having n-type MOSFETs 10A, 10B. Switch 700 further includes a pull-down resistor (R) 235 connected between common source junction 13 and lowest-voltage power supply Vnn 231. Compared to FIG. 3, pull-down resistor 235 is in place of off-state pinned circuit 23. The resistance of pull-down resistor 235 is selected to be much larger than the on-resistance of MOSFETs 10A and 10B so that common source junction 13 is not noticeably affected by Vnn 231 when switch 700 is in the on-state. However, the resistance of pull-down resistor 235 is also selected to be much less than the impedance of reverse-biased diodes 11A and 11B to ensure that the potential of common source junction 13 is pulled down to Vnn 231 when switch 700 is in the off-state.

In operation, level shifter 21 shifts switch control pulse ctr received at port 22 to the floating Vgs voltage difference to turn switch 700 to the on-state. In the on-state, pull-down resistor 235 substantially isolates common source junction 13 from lowest-voltage power supply Vnn 231 despite a small amount of current passing through pull-down resistor 235. This small current only slightly impacts the offset of switch 700 and the amount of the charge injection. When switch 700 is in the off-state, only very tiny current passes through pull-down resistor 235, which covers the leakages from input via diode 11A, from output via diode 11B, and from level shifter 21. As a result, a negligible potential drop occurs across pull-down resistor 235 and common source junction 13 is effectively pinned to the potential of lowest-voltage power supply Vnn 231.

Figure 8:
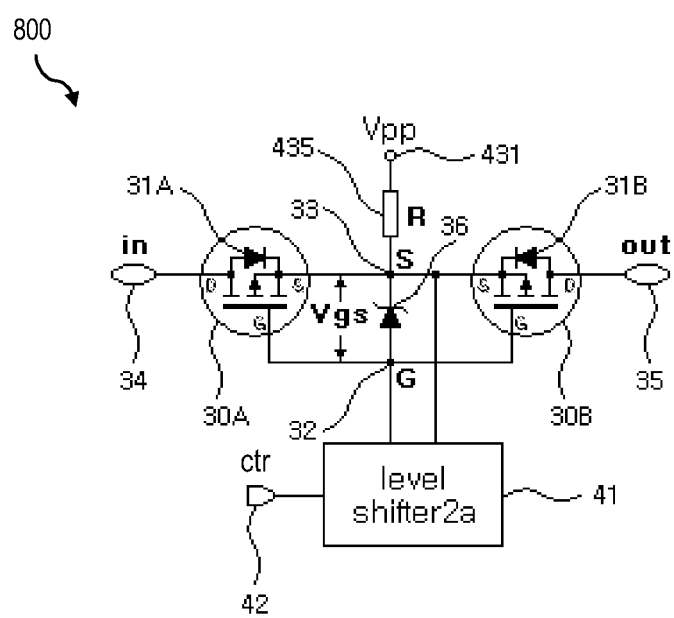
FIG. 8 is a schematic diagram of a high-voltage analog switch that includes a pull-up resistor, in an embodiment.

FIG. 8 is a schematic diagram of an HV analog switch 800 that includes bidirectional analog switch 200, FIG. 2 having p-type MOSFETs 30A, 30B. Switch 800 further includes a pull-up resistor (R) 435 connected between common source junction 13 and highest-voltage power supply Vpp 431. Compared to FIG. 4, pull-up resistor 435 is in place of off-state pinned circuit 43. The resistance of pull-up resistor 435 is selected to be much larger than the on-resistance of MOSFETs 30A and 30B, but much less than the impedance of reverse-biased diode 31A and 31B.

In operation, level shifter 41 shifts switch control pulse ctr received at port 42 to the floating Vgs voltage difference to turn switch 800 to the on-state. In the on-state, a small amount of current will pass through the pull-up resistor which may slightly impact the switch's offset and the amount of the charge injection. When the switch is in the off-state, only very tiny current passes through pull-up resistor 435, which covers any leakage from diodes 31A, 31B, and level shifter 41. A negligible potential drop occurs across the pull-up resistor 435 such that common source junction 33 is effectively pinned to the potential highest-voltage power supply Vpp 431.

The present invention is not limited to the switches configured by a pair of MOSFETs. It can be also applied to switches configured by other types of HV transistors, such as bipolar transistors, MESFETs, and HEMTs. Many different arrangements of the various components depicted, as well as components not shown, are possible without departing from the spirit and scope of the present disclosure. Embodiments of the present disclosure have been described with the intent to be illustrative rather than restrictive. Alternative embodiments will become apparent to those skilled in the art that do not depart from its scope. A skilled artisan may develop alternative means of implementing the aforementioned improvements without departing from the scope of the present disclosure.

It will be understood that certain features and sub-combinations are of utility and may be employed without reference to other features and sub-combinations and are contemplated within the scope of the claims. Not all steps listed in the various figures need be carried out in the specific order described.

What is claimed is:

1. An isolated bidirectional high-voltage analog switch between an input terminal and an output terminal, comprising:
   a first transistor operatively coupled to a second transistor via a common source and a common gate;
   a level shifter operatively coupled to the common source and the common gate;
   a logic circuit configured to receive a switch control pulse and generate a first pulse and a second pulse that is non-overlapped from the first pulse, wherein the level shifter is configured to receive the first pulse for controlling a voltage difference between the common source and the common gate; and
   an off-state pinned switch operatively coupled to the common source and configured to pin the voltage of the common source to a low-voltage power source, wherein the off-state pinned switch is configured to receive the second pulse for controlling the off-state pinned switch.

2. The isolated bidirectional high-voltage analog switch of claim 1, wherein the first transistor and the second transistor are each n-type MOSFETs configured with their sources connected together to the common source.

3. The isolated bidirectional high-voltage analog switch of claim 1, further comprising a Zener diode coupled to the common source the common gate to protect the first transistor and the second transistor from damage.

4. The isolated bidirectional high-voltage analog switch of claim 1, wherein the off-state pinned switch comprises an n-type MOSFET under control of an off-state level shifter configured to receive the second pulse.

5. The isolated bidirectional high-voltage analog switch of claim 1, wherein the off-state pinned switch comprises a NPN transistor under control of the off-state level shifter configured to receive the second pulse.

6. The isolated bidirectional high-voltage analog switch of claim 1, wherein the first transistor comprises a first diode and the second transistor comprises a second diode such that the first and second diodes remain reverse biased when the isolated bidirectional high-voltage analog switch is in an off-state.

7. The isolated bidirectional high-voltage analog switch of claim 6, wherein the off-state pinned switch has an output impedance seen by the common source that is much less than the impedance of the first and second diodes when the isolated bidirectional high-voltage analog switch is in the off-state.

8. The isolated bidirectional high-voltage analog switch of claim 1, wherein the logic circuit is configured to ensure a predetermined timing of the first pulse that is non-overlapped with the second pulse.

9. The isolated bidirectional high-voltage analog switch of claim 1, wherein the low-voltage power source is the lowest voltage power-supply operatively coupled to the isolated bidirectional high-voltage analog switch such that leakage and feedthrough from the input terminal and the output terminal are passed to the low-voltage power source, thereby isolating the input terminal from the output terminal.

10. A bidirectional analog switch, comprising:
a first transistor operatively coupled to an input terminal;
a second transistor operatively coupled to an output terminal, wherein the first transistor and the second transistor are coupled together via a common source and a common gate;
a level shifter operatively coupled to the common source and the common gate for controlling a voltage difference therebetween;
an off-state pinned circuit operatively coupled to the common source and configured to pin the voltage of the common source to a high-voltage source; and
a logic circuit configured to receive an input logic signal, generate a first output logic signal for controlling the level shifter, and generate a second output logic signal for controlling the off-state pinned circuit, such that leakage and feedthrough from the input terminal and the output terminal are passed to the high-voltage power source, thereby isolating the input terminal from the output terminal.

11. The bidirectional analog switch of claim 10, wherein the first transistor and the second transistor are each p-type MOSFETs configured with their sources connected together to the common source junction.

12. The bidirectional analog switch of claim 10, further comprising a Zener diode coupled to the common source and the common gate to protect the first transistor and the second transistor from damage.

13. The bidirectional analog switch of claim 10, wherein the first transistor comprises a first diode and the second transistor comprises a second diode such that, when the switch is in the off-state, the first and second diodes remain reverse biased and the off-state pinned circuit has an output impedance seen by the common source that is much less than the impedance of the first and second diodes.

14. The bidirectional analog switch of claim 10, wherein the logic circuit controls the predetermined timing of the first output logic signal and the second output logic signal with respect to the input logic signal, such that the first output logic signal does not overlap the second output logic signal.

15. A high-voltage bidirectional analog switch, comprising:
a first transistor operatively coupled to an input terminal;
a second transistor operatively coupled to an output terminal, wherein the first transistor and the second transistor are coupled together via a common source and a common gate;
a level shifter operatively coupled to the common source and the common gate for controlling a voltage difference therebetween;
a pull-down resistor that couples the common source to a low-voltage power supply such that leakage and feedthrough from the input terminal and the output terminal are substantially passed to the low-voltage power supply, thereby effectively isolating the input terminal from the output terminal.

16. The high-voltage bidirectional analog switch of claim 15, wherein the first transistor and the second transistor are each n-type MOSFETs configured with their sources connected together to the common source.

17. The high-voltage bidirectional analog switch of claim 15, further comprising a Zener diode coupled to the common source and the common gate to protect the first transistor and the second transistor from damage.

18. A high-voltage bidirectional analog switch, comprising:
a first transistor operatively coupled to an input terminal;
a second transistor operatively coupled to an output terminal, wherein the first transistor and the second transistor are coupled together via a common source and a common gate;
a level shifter operatively coupled to the common source and the common gate for controlling a voltage difference therebetween;
a pull-up resistor that couples the common source to a high-voltage power supply such that leakage and feedthrough from the input terminal and the output terminal are substantially passed to the high-voltage power supply, thereby effectively isolating the input terminal from the output terminal.

19. The high-voltage bidirectional analog switch of claim 18, wherein the first transistor and the second transistor are each p-type MOSFETs configured with their sources connected together to the common source junction.

20. The bidirectional analog switch of claim 18, further comprising a Zener diode coupled to the common source the common gate to protect the first transistor and the second transistor from damage.

* * * * *